United States Patent
Lindqvist (10) Patent No.: US 8,265,232 B2
(45) Date of Patent: Sep. 11, 2012

(54) ESTIMATION OF TRANSMISSION LINE INSERTION LOSS

(75) Inventor: Fredrik Lindqvist, Älvsjö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 843 days.

(21) Appl. No.: 12/373,303

(22) PCT Filed: May 8, 2007

(86) PCT No.: PCT/SE2007/000446
§ 371 (c)(1),
(2), (4) Date: Jan. 12, 2009

(87) PCT Pub. No.: WO2008/008015
PCT Pub. Date: Jan. 17, 2008

(65) Prior Publication Data
US 2009/0245476 A1    Oct. 1, 2009

Related U.S. Application Data

(60) Provisional application No. 60/807,000, filed on Jul. 11, 2006.

(51) Int. Cl.
*H04M 1/24* (2006.01)
(52) U.S. Cl. .......... 379/27.01; 379/1.04; 379/22.04
(58) Field of Classification Search ............ 379/1.03, 379/1.04, 22.02, 22.04, 27.01, 27.03, 26.01, 379/26.02, 26.03, 24, 22.08, 28; 370/241, 370/251, 252
See application file for complete search history.

(56) References Cited

U.S. PATENT DOCUMENTS

| | | | |
|---|---|---|---|
| 6,687,289 B1 | 2/2004 | Bohley | |
| 6,826,258 B2 * | 11/2004 | Afzal | 379/1.04 |
| 6,909,978 B2 | 6/2005 | Bostoen et al. | |
| 6,980,007 B1 * | 12/2005 | Lo et al. | 324/543 |
| 2001/0040457 A1 * | 11/2001 | Iskanius | 324/534 |
| 2002/0186760 A1 | 12/2002 | Bostoen et al. | |
| 2003/0173399 A1 | 9/2003 | Le Henaff | |
| 2005/0063323 A1 | 3/2005 | Scenk | |

FOREIGN PATENT DOCUMENTS

| EP | 0926841 A3 | 6/1999 |
|---|---|---|
| WO | WO 2004099711 A1 * | 11/2004 |
| WO | WO 2005078951 A1 | 8/2005 |

* cited by examiner

*Primary Examiner* — Vivian Chin
*Assistant Examiner* — Leshui Zhang (57) ABSTRACT

A method and arrangement for estimating line insertion loss of a customer transmission line at a frequency (f1) or a plurality of frequencies. Values of line insertion loss for at least two reference transmission lines are pre-measured at each frequency and stored in a memory. A calibration quantity representing an amplitude of a far-end Time Domain Reflectometer (TDR) reflection is also measured for each of the reference transmission lines. The pre-measured line insertion loss of each reference transmission line is then calibrated by the calibration quantities of the reference transmission lines. The calibration quantity for the customer transmission line is then measured, and an estimate of the line insertion loss at each frequency for the customer transmission line is generated based on the calibrated line insertion losses of the reference transmission lines and the measured calibration quantity of the customer transmission line.

26 Claims, 10 Drawing Sheets

ESTIMATION OF TRANSMISSION LINE INSERTION LOSS

RELATED APPLICATIONS

This application claims the benefit of U.S. Provisional Application No. 60/807,000 filed Jul. 11, 2006, the disclosure of which is fully incorporated herein by reference.

FIELD OF INVENTION

The present invention refers to the area of tele-communication and the estimating of a transmission line insertion loss of a customer transmission line at least one frequency.

BACKGROUND

When telecom operators sell DSL to customers, it is a problem that the properties of the telecommunications line to the customer are not sufficiently well known. Because of that, it may not be possible to predict how much DSL capacity (e.g. number of Mbits/second) that the line can support, and hence that can be sold to the customer.

To be able to predict the DSL capacity that can be supported, it is useful to know the values of the line attenuation for the used frequencies. Usually, it is sufficient to know only the magnitude and not the phase. Line attenuation varies with the frequency, so it is usually necessary to know the attenuation for each, or most, of the used frequencies.

If the line attenuation for each frequency is known with sufficient accuracy, and also the line noise (PSD, power spectral density), it is possible to estimate from these the achievable DSL bit rate on the line.

Preferably, any line measurements of line properties should be made using single-ended line testing (SELT), which can be carried out from the operator's premises.

Double-ended line testing requires equipment to be present also at the customer end of the line. Sending technicians to the customer site is expensive, and before deciding to subscribe to a DSL service, customers usually do not have any DSL modem or other equipment that could assist in making a double-ended line test.

Hence, it is desirable to be able to estimate the magnitude of line attenuation by using SELT from the operator premises.

One previous way of estimation is to estimate the length of the line by measuring the arrival time of a time domain reflectometry (TDR) far-end echo of the line. Then, from a standard value for each frequency of attenuation per unit of length of line, attenuation for the particular line is estimated. This method yields unsatisfactory accuracy, likely because attenuation per length unit differs between cable types. It is often not known in advance what type or types of cable that the line is made from.

In the patent application US20050057880A1 is disclosed a method in which a pulse of narrow bandwidth is sent to a line to be measured. A far-end reflection is identified and the line attenuation for the used frequency band is determined directly from the amplitude ratio of the reflected and the sent pulse. An attenuation so determined is in general valid only for the used frequency band of the pulse. It is necessary to determine the magnitude of both the sent and the received pulse. The method is not suitable for implementation in a line card because of the influence on the signal of the line card transceiver.

SUMMARY OF INVENTION

The present invention is concerned with a problem of estimating line insertion loss for a telecommunication customer transmission line by a single ended line test, SELT.

Another problem is to estimate the line insertion loss of the customer transmission line at different frequencies.

A further problem is to estimate the line insertion loss of the customer transmission line via its line card.

Still a problem is to generate a high accuracy estimate of the customer transmission line insertion loss.

The problems are solved by calibration measurements. The line insertion loss for at least two reference transmission lines is pre-measured at predetermined ones of the frequencies. Also a calibration quantity for each of the reference transmission lines is pre-measured, where the calibration quantity substantially represents the amplitude of a far-end TDR reflection. The same calibration quantity is further measured for said customer transmission line, which has an unknown line insertion loss. An estimate of the line insertion loss at said frequencies is generated for the customer transmission line in dependence of said calibration quantity for both the reference transmission lines and the customer transmission line and said pre-measured reference line insertion loss.

The solution can also be considered as the shaping of a line model for the transmission lines, which line model is calibrated with the aid of the pre-measured line insertion loss and the pre-measured calibration quantity. The line insertion loss for the customer transmission line is estimated with the aid of the line model and the calibration quantity measured on the customer transmission line.

The calibration quantity for both the reference transmission lines and the customer transmission line is generated in a single-ended line test. A signal is transmitted to the line in question and a far-end reflected signal is received, from which the calibration quantity is generated. This quantity substantially represents the amplitude of the far-end TDR reflection.

One option in generating the calibration quantity is by a TDR measurement directly on the line. Another option is to transmit a signal via a line card at the near end of the line. A reflected signal is received from which substantially the far-end TDR reflection is generated. The measurement can be performed from either end of the line.

With the aid of the pre-measured insertion loss and the calibration quantity for the reference transmission lines a relationship is established, describing the line model. This relationship is then used to estimate the line insertion loss of the customer transmission line with the aid of the calibration quantity measured on the customer transmission line.

The transmission lines can be terminated by different impedances. To get high accuracy values on the line insertion loss the line model can be calibrated with respect to these different impedances.

An object with the invention is to generate an accurate line insertion loss value of a customer transmission line in a single-ended line test.

Another object is to generate the line insertion loss values without knowing which type of cable the customer transmission line is.

Still an object is to generate the line insertion loss values with very high accuracy.

An advantage with the invention is that an accurate line insertion loss value of a customer transmission line is generated in a simple manner.

Another advantage is that measurements on the customer transmission line can be performed via a line card.

A further advantage is that it is not necessary to know what type of cable the customer transmission line is.

Still an advantage is that the insertion loss of the customer transmission line can be estimated at frequencies different from the frequencies at which the line insertion loss was pre-measured for the reference transmission lines.

Still another advantage is that the single-ended test of the customer transmission line can be performed from either end of the line.

The invention will now be described more closely with the aid of embodiments and with reference to enclosed drawings.

DETAILED DESCRIPTION OF THE INVENTION

As mentioned above it is essential for a network operator to know the properties of a telecommunications transmission line to a customer. The operator then can predict how much DSL capacity that the line can support, and hence that can be sold to the customer. In the following will be described how these line properties can be determined by a SELT (Single Ended Line Test) measurement using calibration.

Figure 1:
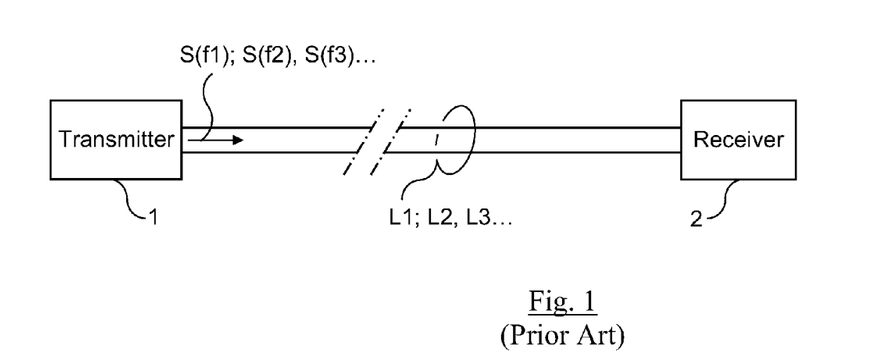
FIG. 1 is a block schematic showing laboratory line insertion loss measuring.

In FIG. 1 is shown how line insertion loss is measured by a double ended line test in a laboratory. A transmitting device 1 is connected to a receiving measurement device 2 via a reference transmission line L1 for telecommunication purposes to be measured. The transmitting device sends a signal S(f1) of a frequency f1 having a specified output amplitude and the measurement device 2 measures a received attenuated amplitude of the signal S(f1). The line insertion loss L11, normally expressed in decibel dB, for the transmission line L1 at the frequency f1 is determined. In the same manner the line insertion loss is measured with signals S(f2) ... S(fN) for further frequencies f2 ... fN. For the reference transmission line L1 there now is a set of line insertion loss values L11 ... L1N for the set of frequencies f1 ... fN.

In the same manner a reference transmission line L2 is measured giving a set of line insertion loss values L21 ... L2N for the set of frequencies f1 ... fN. Further reference transmission lines L3, L4, ..., LK of different types and different lengths are measured in the same manner.

As mentioned, the above described measurements are performed in a laboratory, where the transmission lines e.g. can be wound up on cable drums. Of practical and cost reasons this type of double ended measurements are not suitable for use in field measurements of customer transmission lines. For the latter measurements other methods, such as Time Domain Reflectometry TDR, are more practicable. Below it will be described how a line model for the transmission lines can be calibrated with the aid of both the line insertion loss values L11 ... L1N, L21 ... L2N, ..., LK1 ... LKN and TDR and other methods, used in a certain manner. Very accurate insertion loss values for initially unknown customer transmission lines can then be generated using the calibrated (adapted) line model.

Figure 2A:
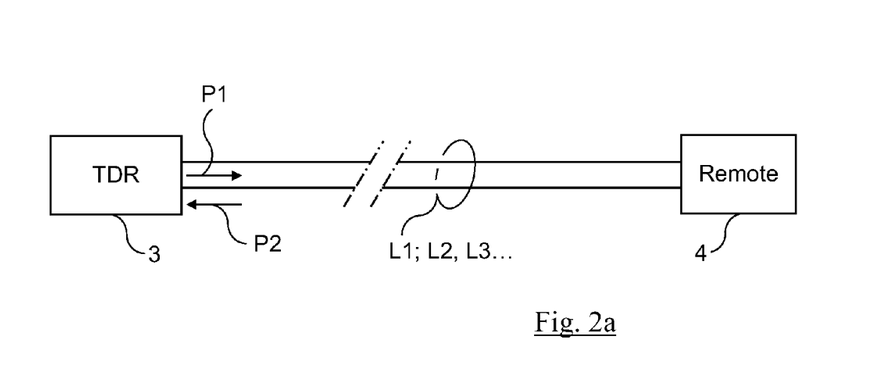
FIG. 2a is a block schematic showing TDR measuring.

In FIG. 2a is shown a TDR measurement device 3 connected to a remote device 4 via the reference transmission line L1. The remote device is in this embodiment simply an open line end and the TDR measurement device 3 transmits a test signal P1, in the embodiment a pulse, to the line L1. The pulse is shown in the diagram in FIG. 2b with time t on the abscissa and amplitude A in dB on the ordinate. The test signal P1 is reflected at the remote device and a reflected signal P2 is measured by the TDR measurement device 3. The reflected signal is shown in FIG. 3, which figure also is a diagram with the time t on the abscissa and the amplitude A in dB on the ordinate. The reflected signal P2 has both a first peak P21, which is recognized as the near end reflection, and an attenuated second peak P22, which is recognized as the far-end TDR reflection or far-end reflection from the open end in the remote device 4. The second peak P22 has a peak amplitude value that is denoted PV1 for the measured reference transmission line L1 and is a calibration quantity for this line.

It is presumed that the peak value PV1 of the far-end reflection is related to the line insertion loss values L11, L12, ..., L1N for the reference transmission line L1 since the pulse P1 has traversed the loop twice (transmission line L1 back and forth). This means that a line model of the transmission lines can be set up, which line model is calibrated with the aid of the line insertion loss values and the peak values for the reference transmission lines. As the peak value in the embodiment is measured in dB it is compared to a reference value RV.

Figure 2B:
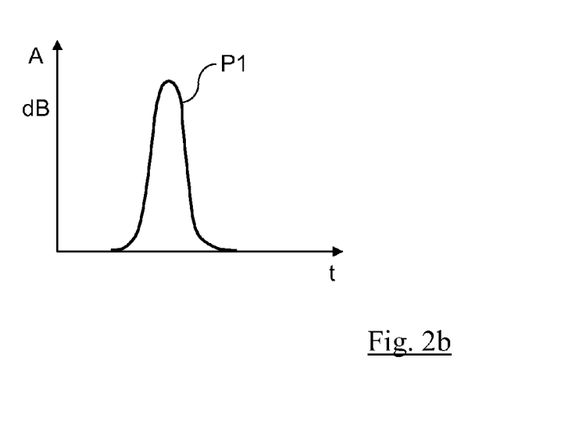
FIG. 2b is a diagram with a TDR pulse.
Figure 3:
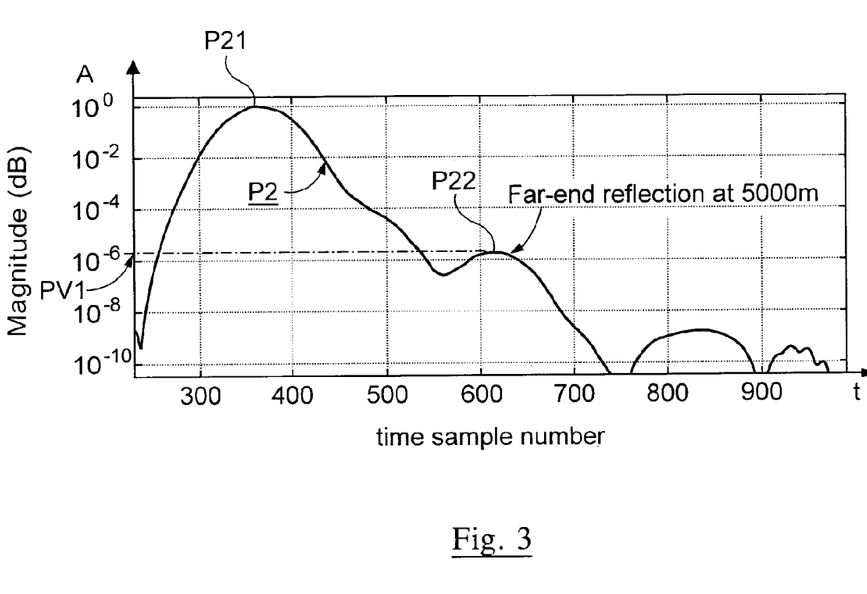
FIG. 3 is a diagram with a reflected TDR signal.

The TDR measurement described in connection with FIGS. 2a and 2b is performed also for the reference transmission lines L2, ..., LK. Corresponding peak values PV2, ..., PVK, the calibration quantities, of the far-end reflection of the pulse P1 are generated and are compared to the reference value RV.

Figure 4:
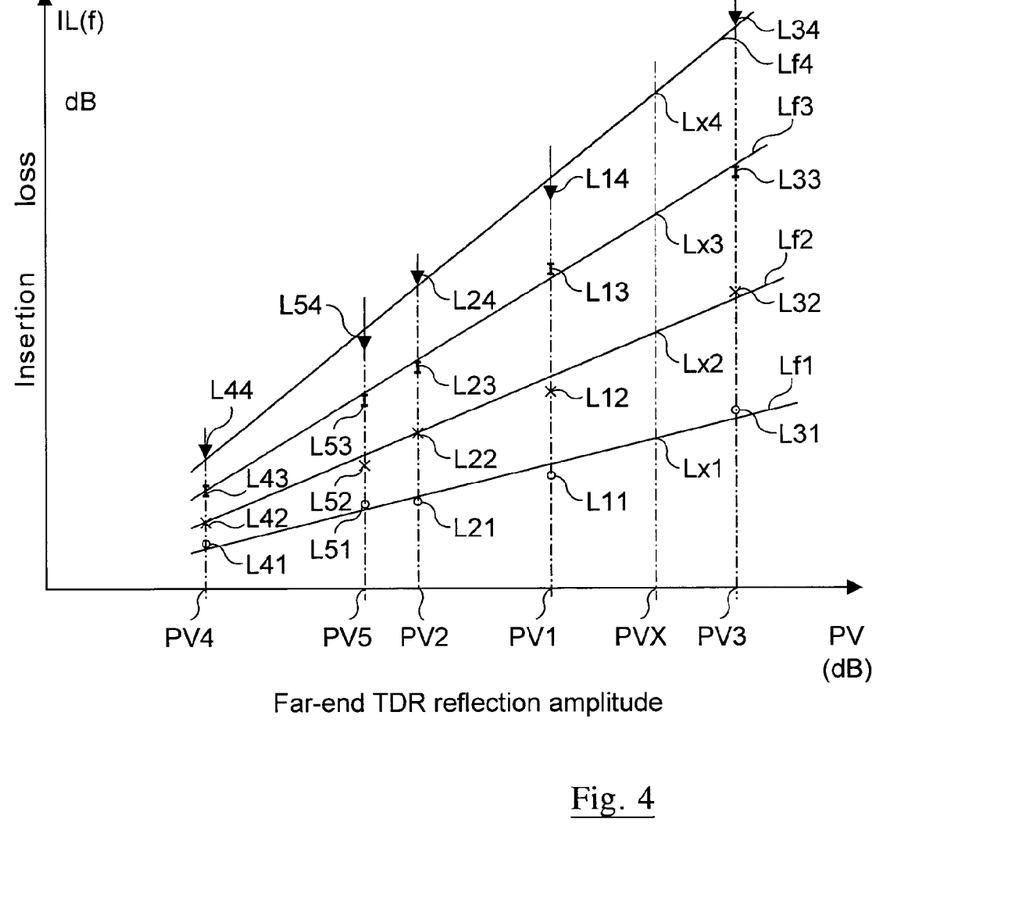
FIG. 4 is a diagram with line insertion loss for different frequencies.

FIG. 4 demonstrates how the peak values of the far-end TDR reflections are related to the line insertion loss values. The figure is a diagram with the peak values from the TDR measurements on the abscissa and the laboratory measured line insertion loss on the ordinate. The peak values are generally denoted by PV and the line insertion loss is generally denoted by IL(f), where f denotes the frequency dependence. The values on both the axes are given in decibel dB. For the reference transmission lines L1 to L5 the corresponding peak values PV1 to PV5 are denoted on the abscissa. For each of the peak values the corresponding line insertion loss values L11 ... L14, L21 ... L24 and so on are denoted.

It appears from the diagram in FIG. 4 that the line insertion loss values for the different lines L1 ... L5 but for one and the same frequency, e.g. the frequency f1, belong to a linear relationship, at least approximately. The values are connected together with straight lines denoted Lf1, Lf2, Lf3 and Lf4 for the respective frequencies f1, f2, f3 and f4. This linear relationship demonstrated in FIG. 4 is a line model for the transmission lines which is calibrated by the line insertion loss values and the peak values for the reference transmission lines.

The use of the peak values and the line insertion loss values can be elaborated in different ways compared to the simple diagram in FIG. 4. This will be described below but first an example will be given on how the line model described by the diagram in FIG. 4 is used to estimate line insertion loss of a customer transmission line.

Figure 5:
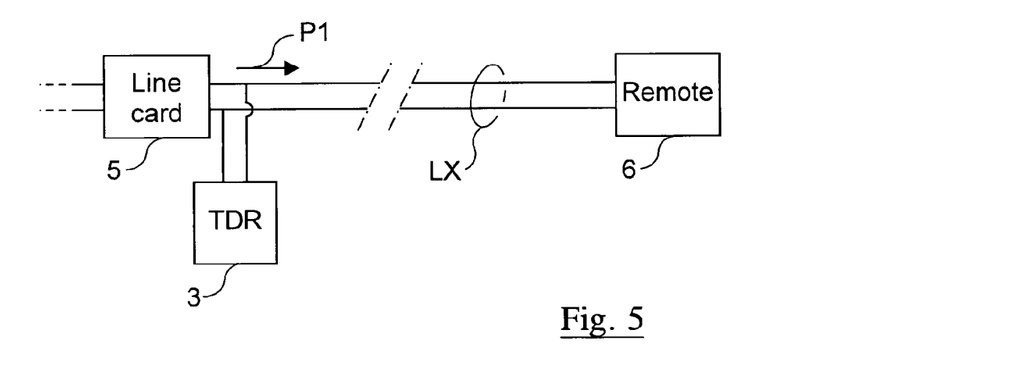
FIG. 5 is a block schematic showing TDR measuring of a customer transmission line.

FIG. 5 shows a customer transmission line LX. The transmission line, which has unknown line insertion loss, is connected to a line card 5 in the near end and a remote device 6 in the far-end. The remote device represents in this embodiment an open line end as earlier. The near end of the transmission line is disconnected from the line card 5 and is connected galvanic to the TDR measurement device 3. The test signal P1 is transmitted and a peak value PVX of the far-end TDR reflection is measured and is the calibration quantity for the customer transmission line LX. The peak value PVX is as earlier compared to the reference value RV. The result is denoted on the abscissa in FIG. 4 and corresponding line insertion loss values LX1, LX2, LX3 and LX4 can be read on the ordinate for the frequencies f1, f2, f3 and f4 on the lines Lf1, Lf2, Lf3 and Lf4.

It should be noted that the calibration measurements are performed in the same manner for both the reference transmission lines and the customer transmission line. Therefore it is not necessary to know the amplitude of the transmitted signal P1, only the amplitude peak value of the far-end reflection is significant.

In an alternative line model for the transmission lines the line insertion loss IL(f) can be expressed mathematically as a function of the peak value PV by a polynomial, generally written as $$IL(f) = c_1(f) + c_2(f) \cdot \log_{10}(PV/RV) + c_3(f) \cdot \{\log_{10}(PV/RV)\}^2 + \quad (1)$$

Here $c_1(f)$, $c_2(f)$ and $c_3(f)$ are frequency dependent line model parameters.

The line insertion loss values for any one of the frequencies in FIG. 4 can thus be interconnected by a polynomial of predetermined order. The values of the line model parameters are determined by adapting the polynomial to the measured values. This will give very accurate results for the line insertion loss IL(f) of an initially unknown customer transmission line but is a bit complicated. It has been observed that a first order polynomial, i.e. a straight line, $$IL(f) = \alpha_1(f) \cdot \log_{10}(PV/RV) + \alpha_2(f) \quad (2)$$

generate values which in many cases are sufficiently accurate. The line is adapted to the measured values by e.g. a least square algorithm.

From laboratory measurements on a great number of different cables it has been demonstrated that the quotient $$C1 = \alpha_2(f)/\alpha_1(f) \quad (3)$$

is approximately independent of frequency. Equation (2) can thus be written $$IL(f) = \alpha_1(f) \cdot \{\log_{10}(PV/RV) + C1\} \quad (4)$$

Still a simplification can be made by involving the reference value RV in a constant C2 such that $$IL(f) = \alpha_1(f) \cdot \{\log_{10} PV + C2\} \quad (5)$$

Thus, instead of plotting the line insertion loss values IL(f) in FIG. 4 the straight lines or higher order curves can instead be generated with the aid of the equations above. Line insertion loss values for the customer transmission line LX can then be calculated with high accuracy by inserting its peak value, the calibration quantity, in the polynomials above.

As appears from FIG. 4 and equation (1) it is necessary to measure on at least two reference transmission lines to calibrate the line model. Also, the more reference transmission lines that are measured the more accurate the line model will be.

In the embodiment described above the remote device 4 or 6 was an open line end, i.e. the line termination had an unlimited impedance. Also other predetermined impedance values of the line termination are possible. One option is a short-circuit, another option is an impedance that is matched to the line impedance, in many cases around 100 ohms. In the latter case the best result is achieved when the line termination impedance is known and there also exist well known methods to estimate this impedance. Irrespectively of which impedance the line termination has it is essential for very accurate results that it is the same predetermined termination impedance for both the reference transmission lines and the customer transmission line when calibrating the line model and measuring on the customer transmission line. It should anyhow be noted that the line model will give fully acceptable values for the customer transmission line insertion loss even if the line model was calibrated with a line termination impedance different from the line termination impedance of the actual customer transmission line.

To get these very accurate results the line model will be calibrated in different editions with a predetermined line termination impedance for each edition. When measuring on the customer transmission line its termination impedance is determined and the corresponding edition of the line model is selected. The selected line model edition is then used when estimating the customer transmission line insertion loss.

In connection with FIG. 5 it was described that the TDR measurement device 3 was connected galvanic to the customer transmission line LX. A direct galvanic connection is not necessary and an option is e.g. to connect the measurement device via a transformer. FIG. 5 also shows that the measurement device is connected at the station side of the line but the customer transmission line can as well be measured from its customer side.

Above the line model for the transmission lines is described as a line model with logarithmic values. FIG. 4 is a diagram in which the values on both the abscissa and the ordinate are denoted in decibel and the equations 1, 2, 4 and 5 all include the logarithmic function. This is not the only option, the line model can be formed in other ways with e.g. linear peak values.

In FIG. 4 the line model for the transmission lines is presented as lines in a diagram and it is also presented as polynomials in equations (1) to (5). A further option to present the line model is in form of a table with the peak values PV1, PV2 . . . and the line insertion loss values L11, L12 . . . , L21, L22 . . . etc. The line insertion loss for the customer transmission line LX is estimated by interpolation in the table.

In connection with FIG. 5 a field measurement on the initially unknown customer transmission line LX was described. The transmission line was disconnected from its line card and the TDR measurement device 3 was connected galvanic to the customer transmission line. The method is a bit costly and an alternative simple and cheap way of measuring the line insertion loss will be described in connection with FIG. 6.

The alternative way of measuring the line insertion loss includes in broad outline the same operations as the method described in connection with FIGS. 1-5: Double ended laboratory measurements on the reference transmission lines, calibration SELT measurements on the same lines, generating of the line model, e.g. the curves in the Peak Value-Insertion Loss diagram, SELT measurements on the unknown customer transmission line and generating line insertion loss for the customer transmission lines. A difference is that instead of measuring directly the peak value PV1 of the second peak P22, the far-end TDR reflection, a calibration quantity is measured that substantially represents the peak value of the far-end TDR reflection.

Figure 6:
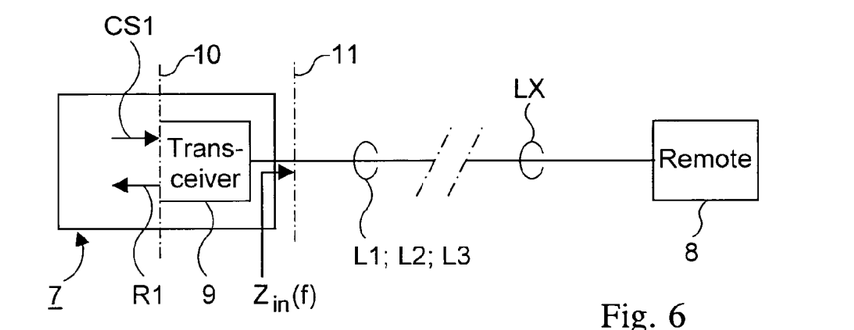
FIG. 6 is a block schematic showing insertion loss measuring via a line card.
Figure 7:
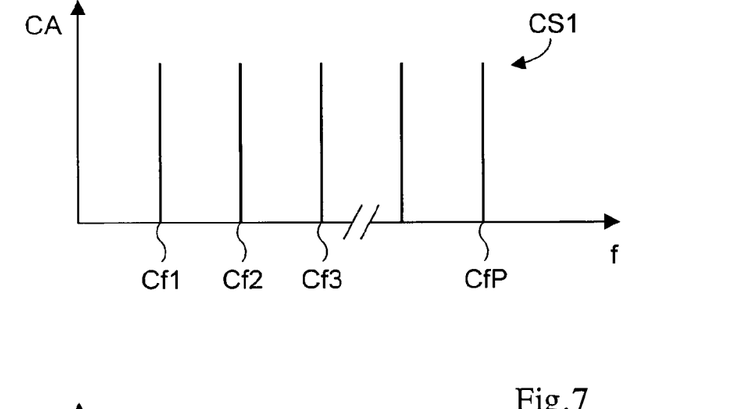
FIG. 7 is a diagram with a line spectrum signal.

FIG. 6 depicts a situation for performing a calibration measurement on the transmission lines L1, L2, L3, . . . , LK. The figure shows a line card 7 connected via the transmission line L1 to a remote device 8, which in the embodiment is an open line end. The line card 7 is exactly the same type as the line card that is used when transmitting services to the customers. The line card 7 has a transceiver 9 connected to the transmission line L1 and has also an interface 10. A test signal CS1 is sent to the line via the interface 10 and a reflected signal R1 is measured via the interface. As the test signal is sent through the transceiver 9 a signal like the pulse P1 is not necessarily used. Instead the test signal CS1 is a line spectrum signal which is continuous in time and which has a number of selected frequencies. The test signal CS1 is shown in FIG. 7, which is a diagram with the frequency f on the abscissa and the amplitude CA on the ordinate. The test signal CS1 includes frequencies Cf1, . . . , CfP which e.g. can be the DSL frequencies. In steady-state the reflected signal R1 is measured in the time domain and is Fourier transformed into a signal CR1 in the frequency domain. Now the echo path transfer function $H_{echo}(f)$ for the transmission line L1 in combination with the transceiver 9 can be generated as $$H_{echo}(f) = CR1/CS1 \qquad (6)$$

Figure 8:
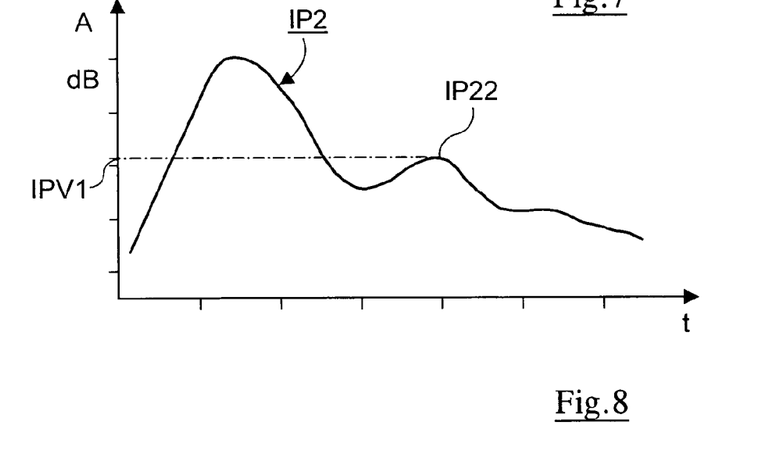
FIG. 8 is a diagram showing an impulse response.

By applying the inverse Fourier transform on the echo path transfer function $H_{echo}(f)$ an impulse response IP2 for the reference transmission line L1 in combination with the transceiver 9 is received. The impulse response IP2 is shown in FIG. 8 and is similar to the reflected pulse P2 in FIG. 3. FIG. 8 is a diagram with the time t on the abscissa and the amplitude A in dB on the ordinate. In the same way as in FIG. 3 the impulse response IP2 has both a first peak which is recognized as the near end reflection, and an attenuated second peak IP22, which is recognized as the far-end echo from the open end in the remote device 8. The amplitude of the second peak has a peak value IPV1 which is a calibration quantity for the reference transmission line L1 that substantially represents the amplitude of a far-end TDR reflection. As the peak value IPV1 is measured in dB on a logarithmic scale it is compared to a reference value RV1. In the same manner as described above the other reference transmission lines L2, L3 . . . are calibrated giving far-end reflections with peak values IPV2, IPV3 . . . .

To get the second peak IP22 more distinct and recognizable it is an option to filter either the echo path transfer function $H_{echo}(f)$ or the impulse response IP2 with appropriate filters. An alternative is to filter the two of them.

Figure 9:
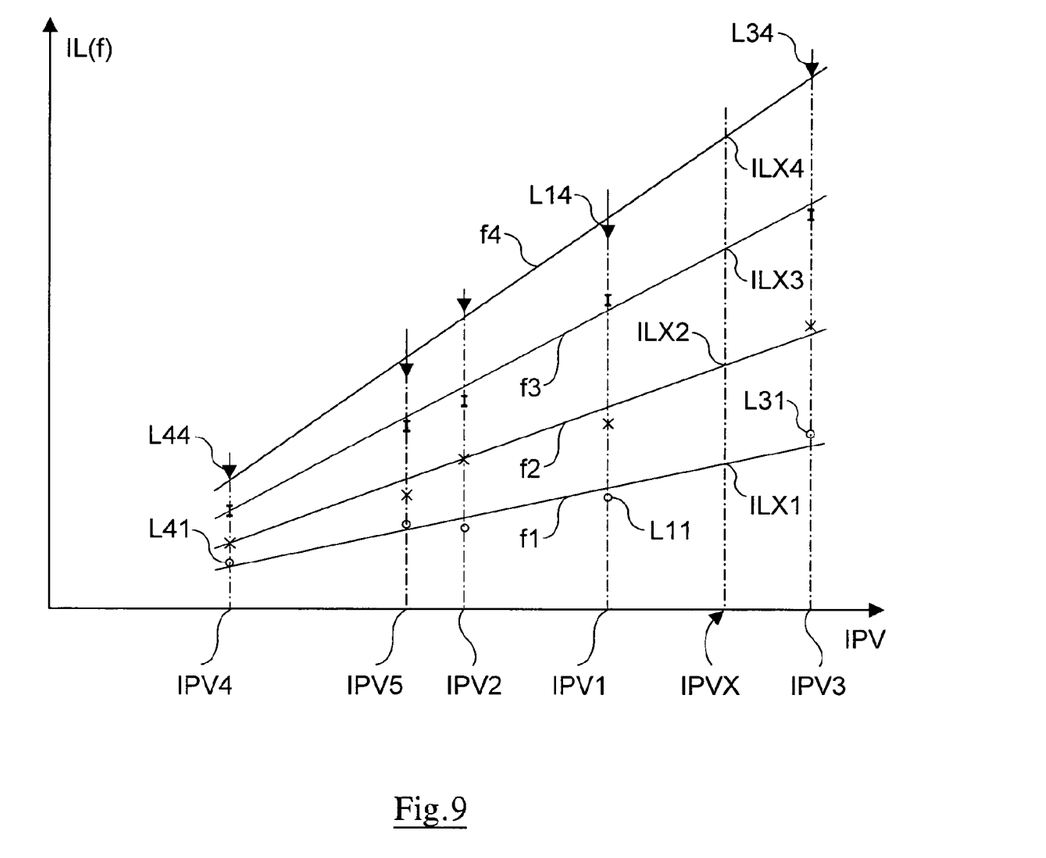
FIG. 9 is a diagram with line insertion loss for different frequencies.

Now a calibration diagram similar to FIG. 4 can be drawn as shown in FIG. 9. The figure is a diagram with peak amplitude on the abscissa, generally denoted IPV. The line insertion loss IL(f) for the reference transmission lines L1, L2, . . . is denoted in dB on the ordinate. Points for the laboratory measured line insertion loss values L11 . . . L14, L51 . . . L54 are plotted in the diagram for the corresponding peak amplitudes IPV1 . . . IPV5, in the same manner as in FIG. 4. Straight lines, one for each of the frequencies f1 . . . f4, are adapted to the plotted points.

The line insertion loss for the initially unknown customer transmission line LX is generated in the following manner. It is presumed that the transmission line LX is a real customer line and that the measurement takes place in the field. The line spectrum test signal CS1 is transmitted via the transceiver interface 10 and the reflected signal R1 is measured. A peak value IPVX for the customer transmission line LX is generated as described above and is the calibration quantity for the customer transmission line. Corresponding insertion loss values ILX1 . . . ILX4 are read in the diagram for the customer transmission line LX. The measurement described above can give an accurate insertion loss value since it is a calibration measurement in which both the reference lines and the customer transmission line are measured in the same manner.

In connection with FIG. 4 the line model was described in which straight lines or higher order curves were mathematically adapted to the measured calibration peak values PV and insertion loss IL(f) for the reference transmission lines. In the same manner and with the equations (1) . . . (5) curves of suitable order can be adapted to the measured peak values IPV and insertion loss IL(f) in FIG. 9. Line insertion loss values for unknown customer transmission lines can then be generated with high accuracy. Also the abovementioned line model with the measured peak values and insertion loss values stored in a table can be adapted.

It should be noted that the frequencies f1 . . . fN of the laboratory insertion loss measurements need in no way be the same as the frequencies Cf1 . . . CfP of the line spectrum signal CS1.

In the embodiment above the test signal CS1 is a line spectrum signal. In a per se known manner also other broadband test signals can be used to generate the echo path transfer function $H_{echo}(f)$.

The line card 7 in FIG. 6 can be replaced by a Digital Subscriber Line Access Multiplexor DSLAM or a Customer Premises Equipment CPE.

An impulse response similar to the impulse response IP2 of FIG. 8 can be generated also from a frequency dependent line input impedance $Z_{in}(f)$ for e.g. the line L1 or LX at an interface 11 in FIG. 6. In an exemplifying embodiment the line input impedance can be generated as $$Z_{in}(f) = \frac{Z_{h0}(f) - Z_{hyb}(f)H_{echo}(f)}{H_{echo}(f) - H_{\infty}(f)} \qquad (7)$$

The parameters to the right are pre-stored transceiver model calibration values which are to be interpreted in the following manner:

The value $H_{\infty}(f)$ is the frequency dependent echo transfer function for the transceiver 9 with open connection to the line, i.e. when the line impedance is of unlimited magnitude.

The value $Z_{hyb}(f)$ is the transceiver impedance as measured at the connections to the line L1, i.e. the transceiver impedance at the interface 11 as seen from the line side. The value $Z_{h0}(f)$ can be expressed as $Z_{h0}(f) = H_0(f) \cdot Z_{hyb}(f)$, in which the value $H_0(f)$ is the frequency dependent echo transfer function for the transceiver 9 with the connections to the line L1 shortcut and the value $Z_{hyb}(f)$ is defined above.

An example on the generating of the echo path transfer function $H_{echo}(f)$ and the line input impedance $Z_{in}(f)$ is described in close detail in the international patent application WO 2004/100512.

A further possibility to generate an impulse response, like the impulse response IP2, is to use a frequency dependent scattering parameter $S_{11}(f)$. An example on how this parameter is generated is to be found in a standardization paper by Thierry Pollet: "How is G.selt to specify $S_{11}$ (calibrated measurements)?", ITU Telecommunication Standardization Sector, Temporary Document OJ-091; Osaka, Japan 21-25 Oct. 2002.

Still a possibility to generate an impulse response is to use e.g. the square of the line input impedance $Z_{in}(f)$, i.e. $(Z_{in}(f))^2$. Also different combinations of the echo path transfer function $H_{echo}(f)$, the line input impedance $Z_{in}(f)$ and the scattering parameter $S_{11}(f)$ are possibilities.

In connection with FIGS. 4 and 5 it was described that different editions of the line model for the transmission line can be determined. The different editions correspond to different termination impedances for the transmission lines. In the embodiments above, with measurements via the line card, it is naturally also possible to form different editions of the line model depending on the termination impedance.

Figure 10:
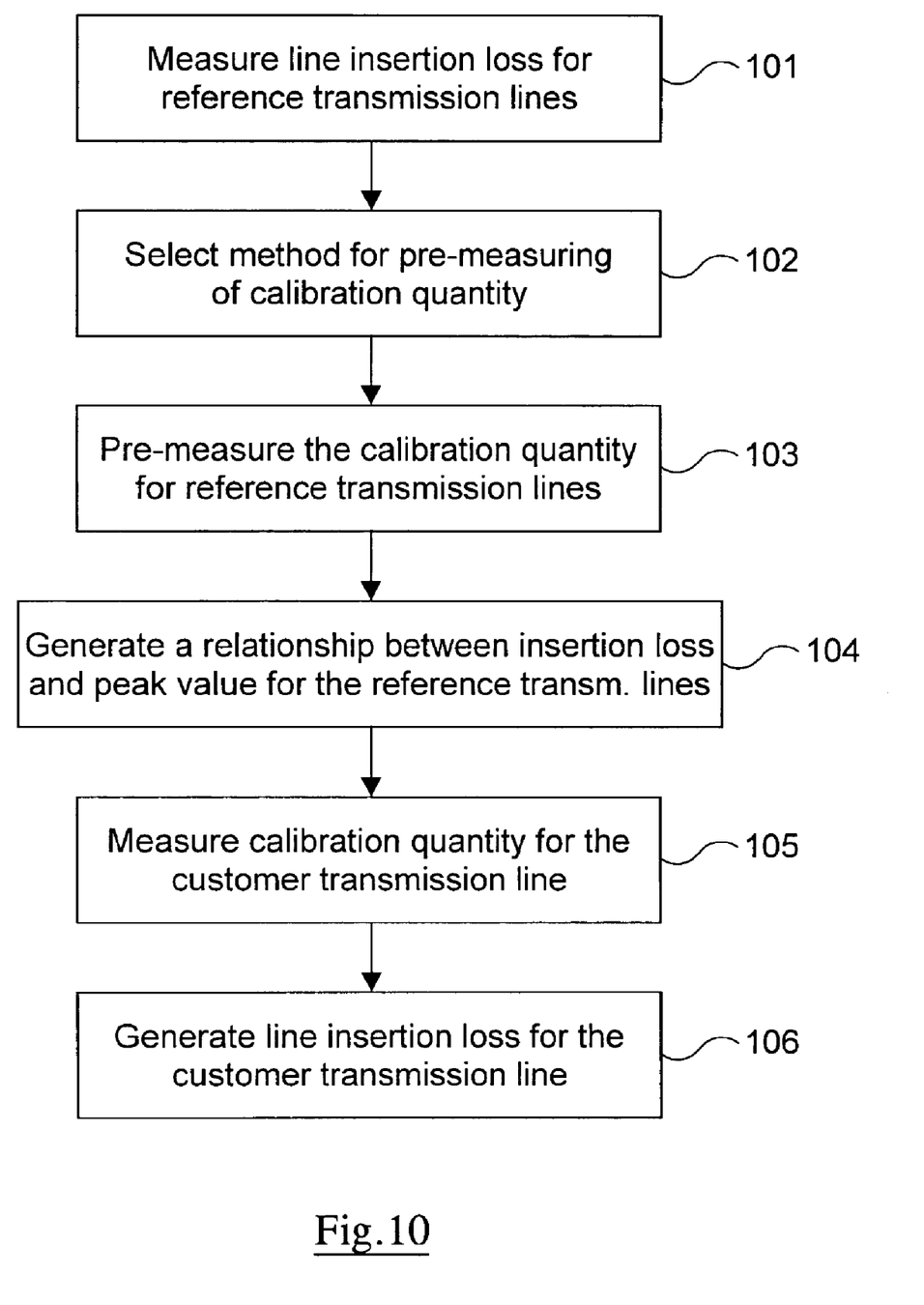
FIG. 10 is a flow chart over the line insertion loss estimation method.

FIG. 10 is a flow chart that shows the method of estimating the line insertion loss for customer transmission lines. The method starts with a step 101, in which the line insertion loss IL(f) is measured for the reference transmission lines L1 . . . LK. The measurement is performed in the double ended line test of FIG. 1 for the set of frequencies f1 . . . fN.

In a step 102 a method is selected for pre-measuring the calibration quantity of the reference transmission lines. One method is the TDR method described in connection with FIGS. 2a, 2b and 3. Another method is that described in connection with FIGS. 6 and 7, using the continuous line spectrum test signal CS1 or another broadband signal. According to the method the echo path transfer function $H_{echo}(f)$ is generated. Still other methods are described using the line input impedance $Z_{in}(f)$ or the scattering parameter $S_{11}(f)$.

The calibration quantity is pre-measured for the reference transmission lines in a step 103. When the TDR method is selected the calibration quantity is the directly measured peak value PV1 . . . PVK of the far-end TDR reflection. When the method with the echo path transfer function $H_{echo}(f)$ is selected the peak value of the far-end echo for the reference transmission lines is generated. The reflected signal R1 is measured, this signal is Fourier transformed into the signal CR1, the echo path transfer function $H_{echo}(f)$ is generated and the impulse response IP2 is generated by applying the inverse Fourier transform. For enhanced performance either the echo path transfer function $H_{echo}(f)$ or the impulse response IP2 or the two of them are filtered. The peak value IPV1 is measured from the impulse response IP2 and is the calibration quantity.

The relationship between the line insertion loss for the different frequencies and the peak value is generated in a step 104 for the reference transmission lines. This can be performed by e.g. the equations (1)-(5) or the diagrams of FIG. 4 or 9.

In a step 105 the calibration quantity PVX, IPVX for the customer transmission line LX is measured in the same manner as in the step 103. The reference transmission lines and the customer transmission line must naturally be handled by the same method for the calibration to work properly.

The line insertion loss for the customer transmission line LX is estimated in a step 106. The estimation is performed for the set of frequencies f1 . . . fN with the aid of the diagram in FIG. 4 or 9 or the equations (1)-(5) of appropriate order.

Figure 11:
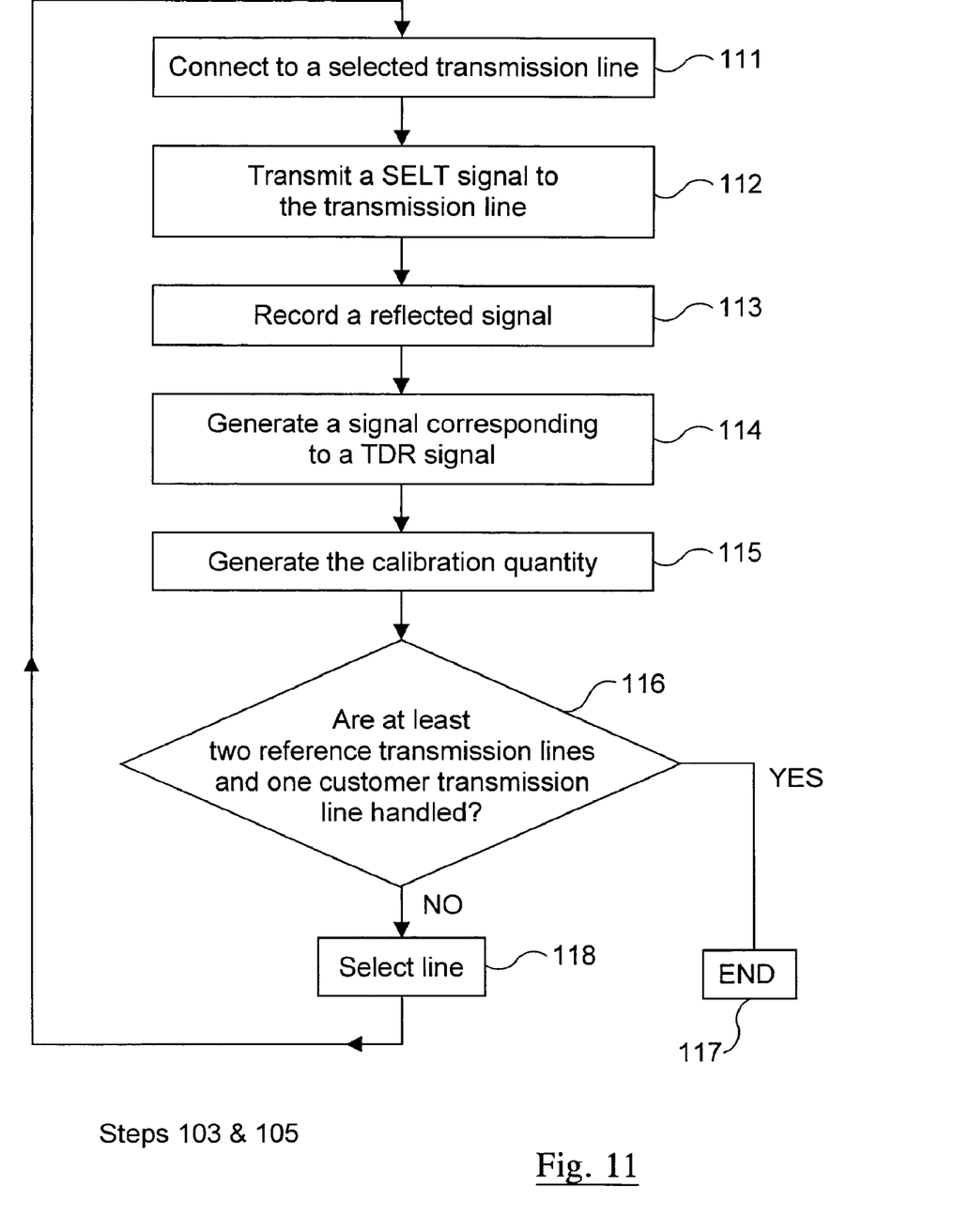
FIG. 11 is a flow chart for generating a calibration quantity.

In connection with FIG. 11 the steps 103 and 105 of FIG. 10 will be described more closely. The method starts with a step 111, in which the TDR measurement device 3 or the line card 7 is connected to a selected one of the transmission lines, either one of the reference transmission lines L1 . . . LK or the customer transmission line LX.

In a step 112 the test signal P1 or the broadband test signal, e.g. the line spectrum test signal CS1, is transmitted at the near end of the selected transmission line.

The reflected signal, P2 or IP2, reflected at the far-end of the transmission line in question, is received at the near end of that transmission line in a step 113.

A signal corresponding to the TDR signal is generated in a step 114. Either the reflected signal P2 is received directly or the impulse response IP2 is generated as described above.

The calibration quantity, the peak value representing the far-end TDR reflection is generated in a step 115.

In a step 116 it is investigated whether at least two of the reference transmission lines L1 . . . LK and the customer transmission line have been handled. In an alternative YES the method ends in a step 117. In an alternative NO a further transmission line is selected in a step 118 and the steps 111-116 are repeated.

Figure 12:
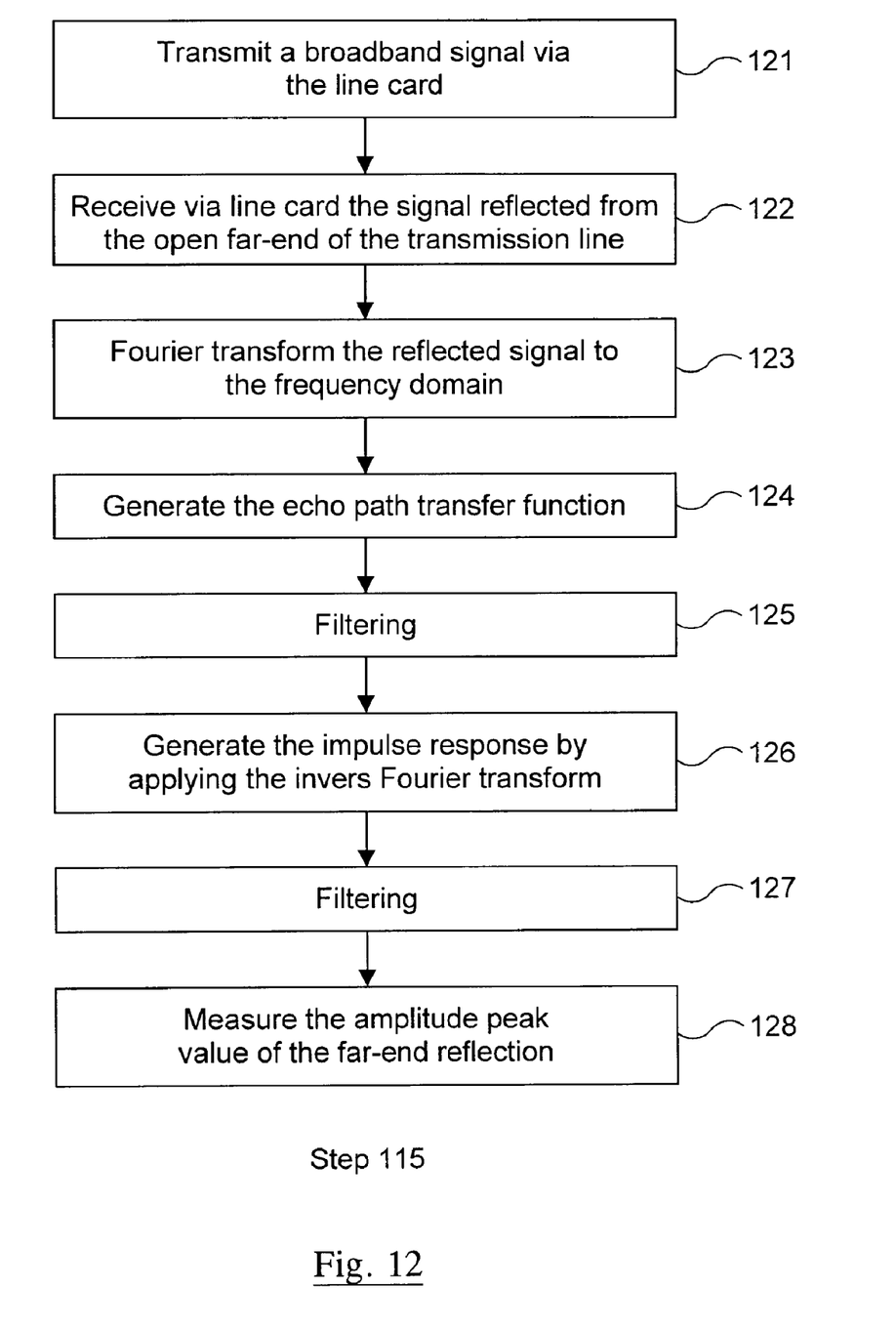
FIG. 12 is a flow chart with details for the generating of the calibration quantity.

The step 115 of generating the calibration quantity will be more closely described in connection with FIG. 12. The figure shows the method with the broadband signal.

In a step 121 the broadband test signal, e.g. the line spectrum test signal CS1, is transmitted via the line card 7.

The signal R1 reflected at the far-end 8 of the transmission line is received via the line card and is recorded in a step 122.

The reflected signal R1, which is in the time domain, is Fourier transformed into the frequency domain in a step 123.

In a step 124 the echo path transfer function $H_{echo}(f)$ is generated. Alternatively the line input impedance $Z_{in}(f)$ or the scattering parameter $S_{11}(f)$ can be generated.

The echo path transfer function $H_{echo}(f)$ (or $Z_{in}(f)$ or $S_{11}$) is, as one alternative, filtered in a step 125

The impulse response IP2 for the transmission line is generated in a step 126 by applying the inverse Fourier transform on either the echo path transfer function $H_{echo}(f)$, the line input impedance $Z_{in}(f)$ or the scattering parameter $S_{11}(f)$.

In a step 127 the impulse response IP2 is filtered in a second alternative. It is not necessary to perform the steps 125 or 127 but is an enhancement and both of them can be performed.

In a step 128 the calibration quantity, the amplitude peak value IPV1 of the far-end reflection, is measured.

Figure 13:
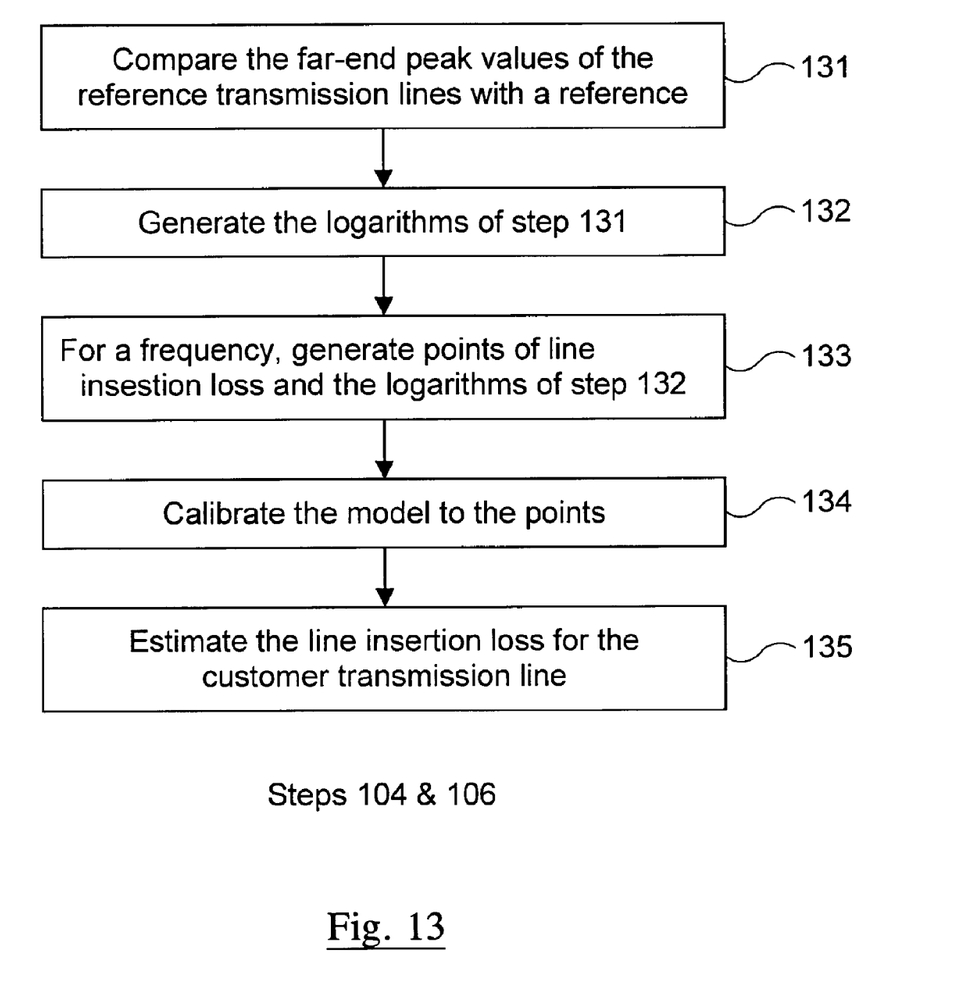
FIG. 13 is a flow chart with details for the generating of the line insertion loss.

In FIG. 13 the generating according to steps 104 and 106 in FIG. 10 of the line model with the relationship between the line insertion loss and the peak value for the reference transmission lines is shown by an example.

In a step 131 the far-end peak values PV1,PV2 . . . or alternatively IPV1,IPV2 . . . for the reference transmission lines L1 . . . LK are compared to the reference value RV or alternatively RV1.

The logarithms of the thus achieved quotients are generated in a step 132.

In a step 133 the points L11 . . . L51 are generated which are determined by the logarithms of step 132 and the pre-measured line insertion loss for a selected one of the frequencies f1. The step 133 is repeated for the other frequencies f2 . . . fN.

In a step 134 a polynomial per frequency is adapted to the points of step 133, thus defining an example of the line model for the transmission lines.

In step 135 the line insertion loss LX1, alternatively ILX1, for the customer transmission line LX is estimated according to step 106 in FIG. 10. Its logarithmic value, generated according to step 132, is inserted in the polynomial for the selected frequency f1. Step 135 is repeated for the frequencies f2 . . . fN.

Figure 14:
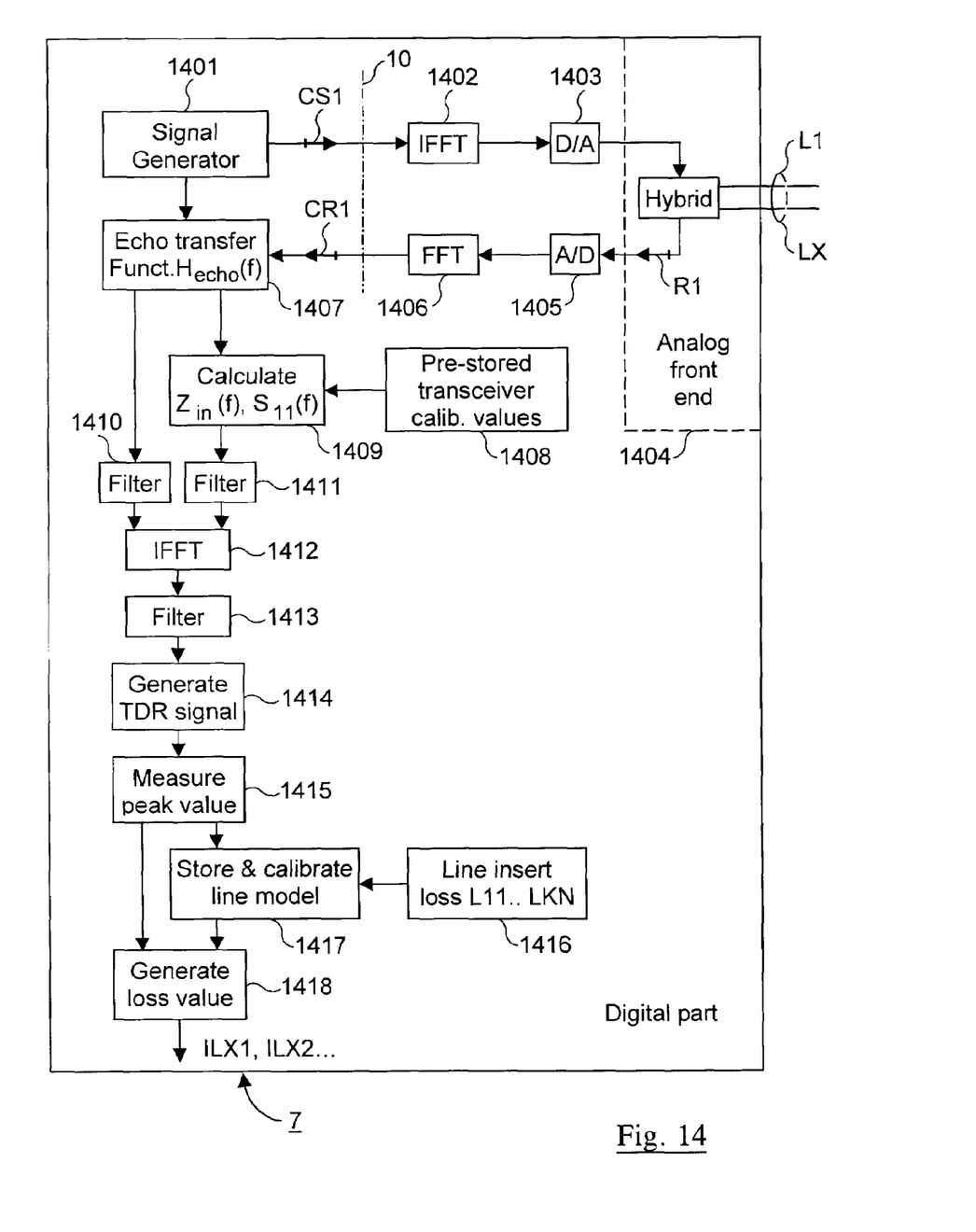
FIG. 14 is a block schematic over a line card.

FIG. 14 shows in more detail the line card 7 in FIG. 6. The line card has an analog front end 1404 with a hybrid circuit and a digital part. The latter includes a signal generator 1401 transmitting the test signal CS1, which is transformed in an inverse Fourier transformer 1402 into the time domain. The transformed signal is digital to analog converted in a D/A converter 1403, sent to the hybrid circuit and is transmitted on the line, e.g. the reference transmission line L1 or the customer transmission line LX. The transmitted signal is reflected at the far-end of the line, is received by the hybrid circuit and is analog to digital converted in an A/D converter 1405 into the reflected signal R1. A Fourier transformer 1406 transforms the reflected signal R1 into the received signal CR1 in the frequency domain and leaves it to an echo transfer function device 1407. In the latter device the echo path transfer function $H_{echo}(f)$ is generated with the use of the test signal CS1 and the received signal CR1. The echo path transfer function $H_{echo}(f)$ is delivered to a filter 1410 or, in alternative embodiments, to a calculating device 1409. The latter is connected to a store 1408 which pre-stores the transceiver model calibration values and calculates either the line input impedance $Z_{in}(f)$ or the scattering parameter $S_{11}(f)$, which is delivered to a filter 1411. The output from either the filter 1410 or the filter 1411 is delivered to the inverse Fourier transformer 1412. The impulse response IP2 is generated in the inverse Fourier transformer, which sends the impulse response to a filter 1413. As mentioned above the filtering is not necessary but enhances the result. Alternatively the filters both before and after the inverse Fourier transformer 1412 can be utilized. The output from the filter 1413 is delivered to a calculation circuit 1415. This circuit recognizes the far-end reflection IP22 of the impulse response and in a measuring device 1415 the amplitude peak value IPV1, i.e. the calibration quantity, is measured.

In the case when the reference transmission lines L1 ... LK are handled the peak values are sent to a model circuit 1417. This circuit stores the peak values and calibrates the line model. This means that when the polynomial of equation (1) is the line model the polynomial is adapted to the points determined by the peak values and the pre-measured line insertion loss values L11 ... LKN for the different frequencies f1 ... fN. The line insertion loss values are received from a store 1416. In the embodiment when the line model is a table, the amplitude peak values are simply stored in the model circuit 1417.

In the case when the customer transmission line LX is handled the amplitude peak value IPVX for this line is sent to a loss value generating circuit 1418, which also receives the calibrated line model from the model circuit 1417. In the loss value generating circuit 1418, the amplitude peak value for the customer transmission line LX is inserted in the line model for the different frequencies f1 ... fN and the line insertion loss values LX1 ... LXN are obtained for the customer transmission line LX. This means that when the line model is the polynomial the circuit 1418 inserts the amplitude peak value IPVX for the customer transmission line LX in the polynomial and outputs the insertion loss values ILX1, ILX2 ... When the line model is the table the circuit 1418 interpolates in the calibrated line model with the help of amplitude peak value IPVX for the customer transmission line LX.

The invention claimed is:

1. A method in a telecommunication network of estimating line insertion loss of a customer transmission line at a frequency (f1), the method comprising the steps of:
   pre-measuring values of line insertion loss for at least two reference transmission lines at the frequency (f1);
   pre-measuring a calibration quantity for each of the at least two reference transmission lines, the calibration quantity representing an amplitude of a far-end Time Domain Reflectometer (TDR) reflection;
   calibrating the pre-measured line insertion loss of each reference transmission line by the calibration quantities of the reference transmission lines;
   measuring the calibration quantity for the customer transmission line; and
   generating an estimate of the line insertion loss at the frequency (f1) for the customer transmission line based on the calibrated line insertion losses of the reference transmission lines and the measured calibration quantity of the customer transmission line.

2. The method according to claim 1, wherein the step of pre-measuring the calibration quantities for the reference transmission lines includes:
   a) transmitting a test signal at a near end of the reference transmission lines;
   b) receiving a reflected signal at the near end of the reference transmission lines, the signal being reflected at a far-end of the reference transmission lines having a line termination of a predetermined impedance; and
   c) generating a signal corresponding to the TDR reflection of the reference transmission lines.

3. The method according to claim 2, wherein:
   the test signal of step a) is a pulse which is connected to the near end of the reference transmission line;
   the reflected signal of step b) is the TDR reflection; and
   the calibration quantity is the amplitude peak value of the far-end TDR reflection.

4. The method according to claim 2, wherein:
   the test signal of step a) is a broadband signal which is transmitted via a line card;
   the reflected signal of step b) is a signal in the time domain which is received via the line card; and
   the generating of the signal of step c) includes:
   e) Fourier transforming the reflected signal into a signal in the frequency domain;
   f) generating an echo path transfer function (Hecho(f)) for the reference transmission line, using the broadband signal and the Fourier transformed reflected signal; and
   g) generating an impulse response for the reference transmission line by applying the inverse Fourier transform on the echo path transfer function (Hecho (f));
   wherein the calibration quantity is the amplitude peak value of the far-end reflection of the impulse response.

5. The method according to claim 4, wherein the broadband signal is a line spectrum signal.

6. The method according to claim 4, wherein the impulse response is filtered to simplify the recognition of its far-end reflection.

7. The method according to claim 2, wherein
   the test signal of step a) is a broadband signal which is transmitted via a line card;
   the reflected signal of step b) is a signal in the time domain which is received via the line card; and
   the generating of the signal of step c) includes:
   e) Fourier transforming the reflected signal into a signal in the frequency domain;
   h) generating a line input impedance (Zin(f)) for the reference transmission line, using the broadband signal and the Fourier transformed reflected signal; and
   i) generating an impulse response for the reference transmission line by applying the inverse Fourier transform on the line input impedance (Zin(f));
   wherein the calibration quantity is the amplitude peak value of the far-end reflection of the impulse response.

8. The method according to claim 2, wherein:
   the test signal of step a) is a broadband signal which is transmitted via a line card;

the reflected signal of step b) is a signal in the time domain which is received via the line card; and the generating of the signal of step c) includes:
  e) Fourier transforming the reflected signal into a signal in the frequency domain;
  k) generating a scattering parameter (S11(f)) for the reference transmission line, using the broadband signal and the Fourier transformed reflected signal; and
  l) generating an impulse response for the reference transmission line by applying the inverse Fourier transform on the scattering parameter (S11(f));
wherein the calibration quantity is the amplitude peak value of the far-end reflection of the impulse response.

9. The method according to claim 1, wherein the step of measuring the calibration quantity for the customer transmission line includes:
  a1) transmitting a test signal at a near end of the customer transmission line;
  b1) receiving a reflected signal at the near end of the customer transmission line, the signal being reflected at a far-end of the customer transmission line having a line termination of a predetermined impedance; and
  c1) generating a signal corresponding to the TDR reflection of the customer transmission line.

10. The method according to claim 9, wherein:
the test signal of step a1) is a pulse which is connected to the near end of the customer transmission line;
the reflected signal of step b1) is the TDR reflection; and
the calibration quantity is the amplitude peak value of the far-end TDR reflection.

11. The method according to claim 9, wherein:
the test signal of step a1) is a broadband signal which is transmitted via a line card;
the reflected signal of step b1) is a signal in the time domain which is received via the line card; and
the generating of the signal of step c1) includes:
  e) Fourier transforming the reflected signal into a signal in the frequency domain;
  f) generating an echo path transfer function (Hecho(f)) for the customer transmission line, using the broadband signal and the Fourier transformed reflected signal; and
  g) generating an impulse response for the customer transmission line by applying the inverse Fourier transform on the echo path transfer function (Hecho(f));
wherein the calibration quantity is the amplitude peak value of the far-end reflection of the impulse response.

12. The method according to claim 9, wherein:
the test signal of step a1) is a broadband signal which is transmitted via a line card;
the reflected signal of step b1) is a signal in the time domain which is received via the line card; and
the generating of the signal of step c1) includes:
  e) Fourier transforming the reflected signal into a signal in the frequency domain;
  h) generating a line input impedance (Zin(f)) for the customer transmission line, using the broadband signal and the Fourier transformed reflected signal; and
  i) generating an impulse response for the customer transmission line by applying the inverse Fourier transform on the line input impedance (Zin(f));
wherein the calibration quantity is the amplitude peak value of the far-end reflection of the impulse response.

13. The method according to claim 9, wherein:
the test signal of step a1) is a broadband signal which is transmitted via a line card;
the reflected signal of step b1) is a signal in the time domain which is received via the line card; and
the generating of the signal of step c1) includes:
  e) Fourier transforming the reflected signal into a signal in the frequency domain;
  k) generating a scattering parameter (S11(f)) for the customer transmission line, using the broadband signal and the Fourier transformed reflected signal; and
  l) generating an impulse response for the customer transmission line by applying the inverse Fourier transform on the scattering parameter (S11(f));
wherein the calibration quantity is the amplitude peak value of the far-end reflection of the impulse response.

14. The method according to claim 1, wherein the step of generating an estimate of the line insertion loss at the frequency (f1) for the customer transmission line includes:
  performing different calibrations of the pre-measured line insertion losses of the reference transmission lines, wherein different line termination impedances are used for the different calibrations; and
  selecting one of the calibrations for the generation of the line insertion loss of the customer transmission line, wherein the customer transmission line and the selected calibration have essentially the same line termination impedance.

15. The method according to claim 1, wherein the step of generating an estimate of the line insertion loss at the frequency (f1) for the customer transmission line includes:
  adapting a polynomial of predetermined order to points determined by both the pre-measured line insertion loss values of the reference transmission lines for the frequency (f1) and the corresponding pre-measured calibration quantities for the reference transmission lines; and
  estimating the line insertion loss of the customer transmission line by inserting its calibration quantity in the polynomial.

16. The method according to claim 15, wherein the polynomial is a first order, straight line, polynomial.

17. The method according to claim 15, wherein the method is performed to estimate the line insertion loss of the customer transmission line at a plurality of frequencies.

18. An arrangement in a telecommunication network for estimating line insertion loss of a customer transmission line at a frequency (f1), the arrangement comprising:
  means for storing pre-measured values of line insertion loss for at least two reference transmission lines at the frequency (f1);
  means for measuring a calibration quantity for each of the at least two reference transmission lines and the customer transmission line, wherein the calibration quantity represents an amplitude of a far-end Time Domain Reflectometer (TDR) reflection;
  means for calibrating the pre-measured line insertion loss of each reference transmission line by the calibration quantities of the reference transmission lines; and
  a line model for estimating the line insertion loss at the frequency (f1) for the customer transmission line based on the calibrated line insertion losses of the reference transmission lines and the measured calibration quantity of the customer transmission line.

19. The arrangement according to claim 18, wherein the means of measuring the calibration quantity includes:
  a signal generator for transmitting a signal at a near end of each of the reference transmission lines and the customer transmission line;

means for receiving a reflected signal at the near end of each of the reference transmission lines and the customer transmission line, the signal being reflected at a far-end of the transmission lines, each having a line termination of a predetermined impedance;

means for generating a signal corresponding to the TDR far-end reflection of the customer transmission line and the reference transmission lines; and a measuring device for measuring the amplitude peak value of the far-end TDR reflection.

20. The arrangement according to claim 19, further comprising a line card, the line card further including:

a signal generator for transmitting a broadband signal;

the means for receiving the reflected signal, wherein the receiving means receives the reflected signal in the time domain and includes an analog front end;

a Fourier transformer for transforming the reflected signal into a corresponding signal in the frequency domain; and an echo transfer function device for generating an echo path transfer function (Hecho(f)) for the reference transmission lines and the customer transmission line using the broadband signal and the Fourier transformed reflected signal.

21. The arrangement according to claim 20, wherein the line card also includes:

an inverse Fourier transformer for generating an impulse response for the reference transmission lines and the customer transmission line by applying an inverse Fourier transform on the echo path transfer function (Hecho(f)); and means for generating the calibration quantity, which is the amplitude peak value of the impulse response representing an amplitude of the far-end TDR reflection.

22. The arrangement according to claim 21, wherein the line card also includes a filter for filtering the impulse response.

23. The arrangement according to claim 20, wherein the line card also includes:

a memory for pre-storing transceiver model calibration values;

a calculating device for generating a line input impedance for the reference transmission lines and the customer transmission line using the echo path transfer function (Hecho(f));

an inverse Fourier transformer for generating an impulse response for the reference transmission lines and the customer transmission line by applying an inverse Fourier transform on the line input impedance (Zin(f)); and means for generating the calibration quantity, which is the amplitude peak value of the impulse response representing an amplitude of the far-end TDR reflection.

24. The arrangement according to claim 20, wherein the line card also includes:

a memory for pre-storing transceiver model calibration values;

a calculating device for generating a scattering parameter for the reference transmission lines and the customer transmission line using the echo path transfer function (Hecho(f));

an inverse Fourier transformer for generating an impulse response for the reference transmission lines and the customer transmission line by applying an inverse Fourier transform on the scattering parameter; and means for generating the calibration quantity, which is the amplitude peak value of the impulse response representing an amplitude of the far-end TDR reflection.

25. The arrangement according to claim 24, wherein the line card also includes:

a memory for storing the pre-measured line insertion loss values;

a model circuit for storing the amplitude peak values of the reference transmission lines and for calibrating the line model utilizing the amplitude peak values and the insertion loss values for the reference transmission lines; and a loss value generating circuit for receiving the line model and for generating the line insertion loss values for the customer transmission line utilizing the line model and the amplitude peak value for the customer transmission line.

26. The arrangement according to claim 24, wherein the arrangement includes means for estimating the line insertion loss of the customer transmission line at a plurality of frequencies.

* * * * *